United States Patent [19] [11] Patent Number: 4,495,215
Barnert et al. [45] Date of Patent: Jan. 22, 1985

[54] FLUIDIZED BED FURNACE AND METHOD OF EMPTYING THE SAME

[75] Inventors: Eike Barnert, Jülich; Heinz Schmitz, Aachen, both of Fed. Rep. of Germany

[73] Assignee: Kernforschungsanlage Jülich GmbH, Jülich, Fed. Rep. of Germany

[21] Appl. No.: 457,054

[22] Filed: Jan. 10, 1983

Related U.S. Application Data

[63] Continuation of Ser. No. 269,651, Jun. 2, 1981, abandoned.

[30] Foreign Application Priority Data

Jun. 3, 1980 [DE] Fed. Rep. of Germany ....... 3021037

[51] Int. Cl.³ .................. B05B 1/34; C23C 11/00
[52] U.S. Cl. ........................... 427/6; 427/213; 118/716; 118/303; 118/DIG. 5
[58] Field of Search .............. 118/716, 303, DIG. 5; 427/6, 213; 422/145; 34/57 A; 376/414, 415, 416, 417

[56] References Cited

U.S. PATENT DOCUMENTS

| | | | |
|---|---|---|---|
| 3,329,506 | 7/1967 | Smith, Jr. .................. | 34/57 A |
| 3,617,347 | 11/1971 | Kuratomi .................. | 118/716 X |
| 4,080,927 | 3/1978 | Brown .................. | 427/6 X |
| 4,098,224 | 7/1978 | Noren et al. .................. | 118/716 |
| 4,153,004 | 5/1979 | Barnert .................. | 118/716 |
| 4,221,182 | 9/1980 | Brown .................. | 118/716 |
| 4,387,120 | 6/1983 | Barnert .................. | 427/6 X |
| 4,407,230 | 10/1983 | Barnert .................. | 118/716 |

Primary Examiner—John D. Smith
Assistant Examiner—Bernard F. Plantz
Attorney, Agent, or Firm—Frishauf, Holtz, Goodman & Woodward

[57] ABSTRACT

A fluidized bed furnace for coating fuel particles for nuclear reactors, particularly high temperature reactors, can be emptied without cooling down the reaction tube by substituting an inert gas for the coating gas and then lowering the inner tube through which this gas is fed so as to clear a passage in the surrounding outer gas feed tube through which the kernels may fall down to a diverting device in the intermediate space between the inner and outer tubes that guides the kernels to a discharge tube. The reaction tube is emptied by lowering the feed gas pressure by cutting off the carrier gas flow and regulating the escape of the inert gas through an overflow pipe. After the reactor is emptied, the flow of carrier gas can be restored and the overflow pipe shut, so that the reactor can be refilled, after which the flow of coating gas is restored and another coating operation can begin without delay.

10 Claims, 6 Drawing Figures

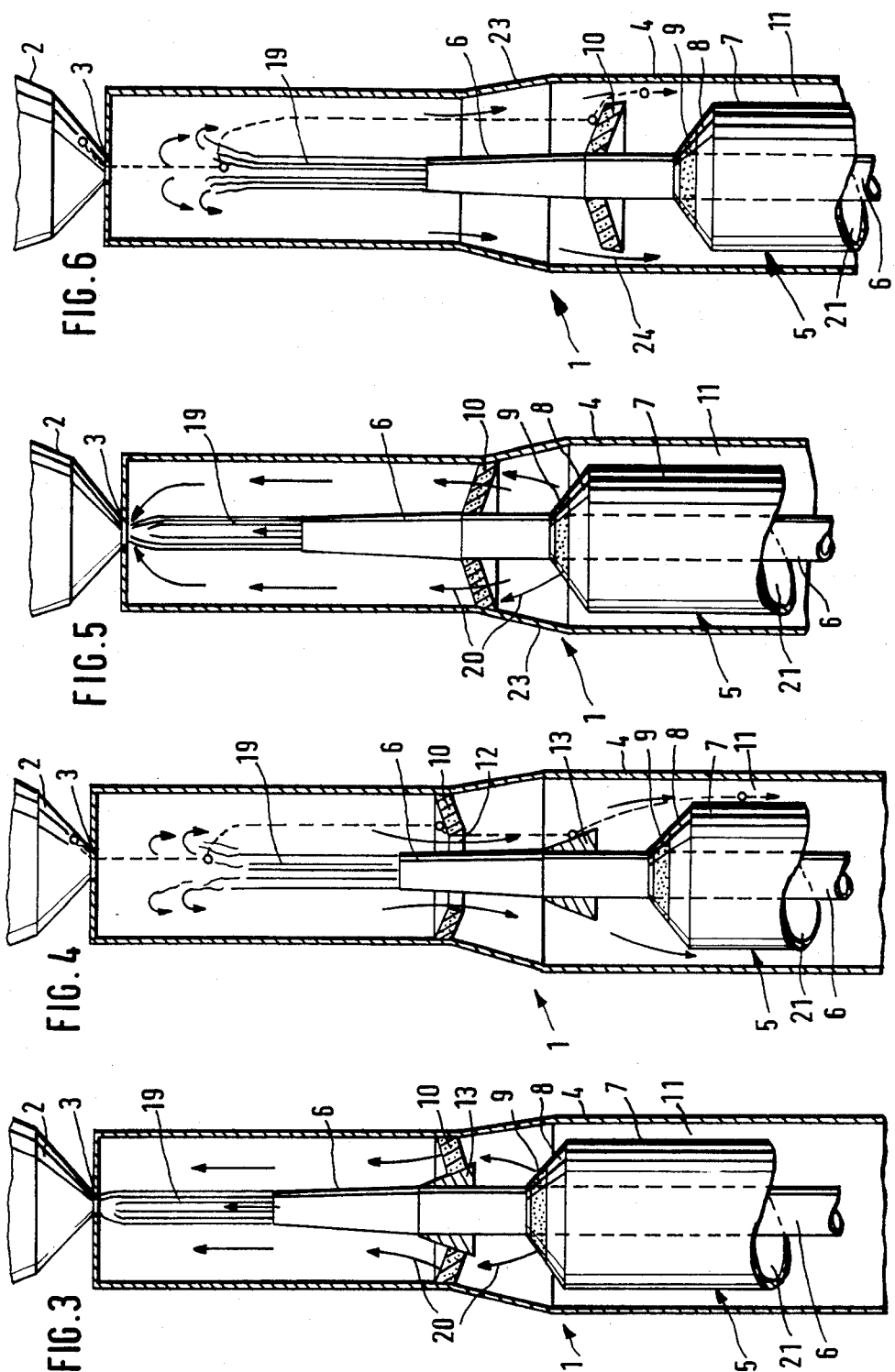

FLUIDIZED BED FURNACE AND METHOD OF EMPTYING THE SAME

This is a continuation, of application Ser. No. 269,651, filed June 2, 1981, now abandoned.

The invention concerns a fluidized bed furnace for the coating of fuel particles for nuclear reactors of the so-called pebble core type, and particularly fuel core particles for high-temperature reactors equipped with a reaction tube for holding the cores, the bottom end of the reaction tube having at least one orifice in a diaphragm and an outer tube connected below, together with at least one inner tube, both disposed beneath the diaphragm orifice. In the intermediate space between the outer tube and inner tube or tubes, a porous plate is disposed, the intermediate space being provided for the supplying of a carrier gas and the inner tube for the supplying of a coating gas.

Fuel core particles for nuclear reactors are coated with a suitable material in order to prevent the giving off of fission products. The coating is performed in a fluidized bed furnace at reaction temperatures between 1000° and 2200° C., by supplying, to the core particles, a carrier gas, such as argon, helium, hydrogen, nitrogen, carbon monoxide, or the like, and a coating gas suitable for pyrolysis, such as methane, acetylene, propane, propylene, chlormethylsilane, molybdenum-V-chloride, or the like. The carrier gas in this case serves for reducing the concentration of the coating gas and, in addition, provides thorough agitation or fluidizing of the bed of core particles in the furnace.

Such a fluidized bed furnace is described in published German patent application (AS) 26 11 844. The core particles there are filled from above into a reaction tube that has an opening at the bottom centered in a diaphragm of the structure below the reaction tube. The mixture of coating and carrier gas is blown into this diaphragm opening at such a velocity that the core particles do not fall downwards through the opening and, moreover, are maintained in a circling movement. The supply of the coating gas is provided by an inner tube having its exit orifice below and at a spacing from the diaphragm opening, while the supply of carrier gas is provided by the intermediate space formed between the inner tube and the outer tube that surrounds the inner tube concentrically. In this intermediate space, a porous plate is set that has the effect of making uniform the velocity profile of the carrier gas.

After the core particles are coated, they must be removed from the fluidized bed furnace. In the known furnaces, this is performed by sucking these core particles by means of a suction lance or by taking out the reaction tube and shaking its contents out of it. It is, however, necessary, for this to disassemble the oven partially, or at least to, first cool it down greatly. As a result, there are thus produced "down-time" periods, such as the period required for the subsequent heating up of the furnace for the next charge of fuel core particles. This emptying procedure accordingly involves substantial energy losses related to waste of heat.

SUMMARY OF THE INVENTION

This invention has the object to constitute a fluidized bed furnace of the above-described type in such a fashion that it can be emptied, even while operated continuously in a heated condition, without disassembling of furnace parts.

The object is achieved in accordance with the invention by making the inner tube of the gas feed system withdrawable downwards so far, that a downward passage for the falling particles is produced at the porous plate and by providing a gathering device in the intermediate space for catching the core particles. With this arrangement, the fluidized bed oven can be emptied by means of a process in which, after a duration of the coating operation corresponding to the layer thickness to be provided, the coating gas is replaced in the inner tube of the feed system by an inert gas, and the supply of the carrier gas is interrupted, and in which process then, further, the inner tube is drawn down and, finally, the inert gas flow is deflected in such a way that the particles fall out of the reaction tube, passing around the mouth of the inner tube, so that they then are caught in the gathering device. In this manner, the fuel core particles can be at once removed from the reaction tube after the termination of the coating process without prior cooling down, and a new charge can be put in. The inert gas stream coming out of the inner tube assures that the downwards-falling core particles do not get into the inner tube, but remain in the intermediate space where they are caught by the gathering device. After drawing off of the coated core particles, the inner tube is again raised, and the supply of the carrier gas is again turned on. As soon as the new charge has been filled, the inert gas coming out of the inner tube is replaced by the coating gas in a continuous transition.

In construction of the invention, it is envisaged that the upper end of the inner tube should be capable of being lowered until it is below the porous plate, the latter having a fixed location in the feed pipe system. The lowering of the inner tube should then continue further to such an extent that the laminar gas flow out of the inner tube does not reach the porous plate, so that the fuel core particles can fall through the hole in the porous plate without difficulty.

According to the invention, it is further envisaged that the inner tube should have a thickening that is preferably conical in shape, tapering upwards, by which it is seated in the porous plate and which in the lowered position of the inner tube leaves free a passage in the shape of a ring gap. This configuration has the advantage that the upper end of the inner tube does not have to be lowered to a place far below the porous plate, but only far enough for the conical shoulder to open up the annular passage.

The same goal can also be reached by attaching the porous plate to the inner tube itself, lowering the plate with the tube, and by providing a widening of the outer tube in the region of the porous plate. In this manner, there arises, between the outer rim of the porous plate and the outer tube, an annular passage through which the coated fuel core particles can fall downwards.

The gathering device can be constituted by a catching obstruction in the intermediate space having a catch surface that leads obliquely outwards to a discharge tube that preferably runs horizontally in axial section. The fuel core particles are led by the oblique catching surface into the discharge tube where they fall into a container filled with an inert gas. According to a further feature of the invention, it is recommended that the intermediate space should be connected to an overflow line by means of a valve.

Through this valve, since the pressure drop is less than through the fluidized bed, enough of the inert gas flow escapes here that the arriving stream of particles is reduced to a rate such that the fuel core particles then fall downwards out of the reaction. By corresponding setting of the valves, the velocity of the emptying process can be controlled. If, as above described, a discharge tube is provided, there is offered the possibility of connecting the overflow line to this discharge tube.

In a further development of the invention, it is provided that the inner tube, at its portion below the porous plate, should be equipped with a casing tube having exits at its upper end, while the annular space between the casing tube and the inner tube serves for the supplying of the carrier gas into the intermediate space within the outer tube. Inner tube and casing tube in this case constitute a unit that can be lowered which is particularly compact and which, moreover, permits catching of the fuel core particles without difficulty in the intermediate space. It is practical in this case to provide the exits from the casing tube with a porous ring.

BRIEF DESCRIPTION OF THE DRAWINGS

In the drawings, the invention is further illustrated with reference to examples of embodiments.

In the drawings

FIG. 3 shows the upper part of another gas feed unit of a fluidized bed furnace in the coating operation position;

FIG. 4 shows the upper part of a gas feed system according to FIG. 3 in the emptying position;

FIG. 5 shows the upper part of still another gas feed system of a fluidized bed furnace in the coating operation position; and FIG. 6 shows the upper part of a gas feed system in accordance with FIG. 5 in the emptying position.

DESCRIPTION OF THE ILLUSTRATED EMBODIMENTS

Figures 1, 2:
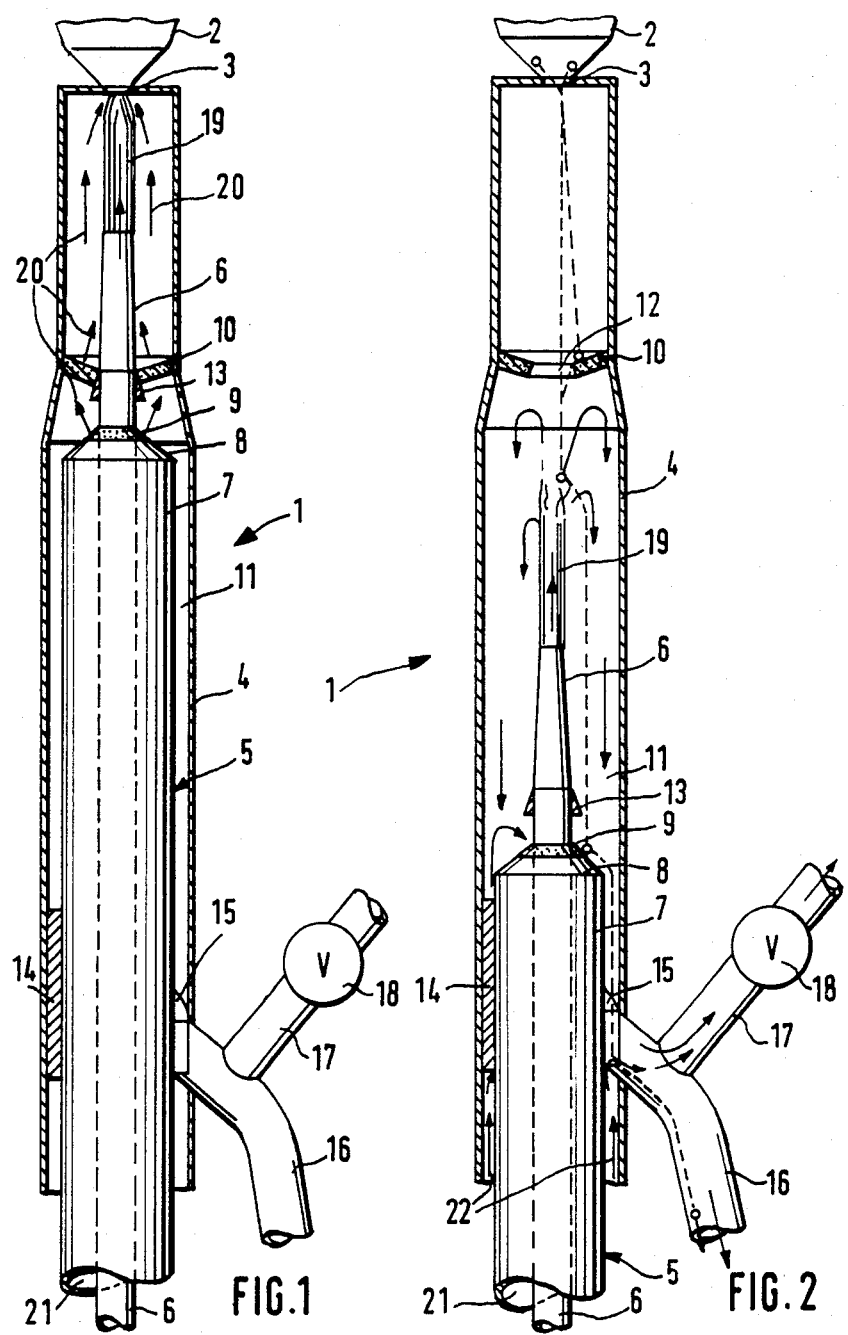
FIG. 1 discloses a feed flow system of a fluidized bed furnace as disclosed for a coating operations.
FIG. 2 gas shows the feed system of FIG. 1 in the emptying position.

In all figures the same or functionally equivalent parts have the same reference numerals. The lower part of the fluidized bed furnace shown in FIGS. 1 and 2 consist of a gas feed system 1 and the lower portion of a reaction to 2, into which the fuel core particles are filled for the coating process. The reaction to 2 tapers down at its lower end and there has a clear opening 3 defined by a diaphragm or plate.

The gas feed unit 1 has an outer tube 4 that is disposed concentrically to the diaphragm opening 3. In this outer tube 4 there is set, likewise concentrically, a gas supply lance 5 that is movable in the axial direction. It consists of an inner tube 6 and a casing tube 7 concentric to the inner tube 6 surrounding the latter up to its upper portion. The upper end 8 of the casing tube 7 tapers conically to meet the inner tube 6, where it is provided with a porous ring 9. The mouth of the inner tube 6 terminates at a spacing from the diaphragm opening 3.

Above the end 8 of the casing tube 7, a porous plate 10 is provided which covers the intermediate space 11 between the inner tube 6 or the casing tube 7 and the outer tube 4. The plate is fixed at its rim to the outer tube 4 and is conically inclined inwards. The porous plate 10 has a bore 12 for passage of the inner tube 4. In order to provide a tight seat, the inner tube is surrounded by a conical ring 13, which corresponds in shape with the similarly constituted bore 12.

In the lower region of the outer tube 4 a catching body 14 is disposed, plugging the intermediate space 11. Its upper end has a helical catching surface 15. Its lower end leads into a discharge tube 16 which branches out from the outer tube 4. An overflow line 17 equipped with a valve 18 goes upwardly from this off-take tube 16.

The gas feed system 1 illustrated in FIG. 1 works as follows:

FIG. 1 shows the gas feed unit 1 in the coating operation position, i.e., the fuel core particles filling the reaction tube 2 are being coated by means of a coating gas. This coating gas is blown in a laminar central stream 19 by the inner tube 6 through the diaphragm opening 3 and then penetrates into the bed formed by the fuel core particles. In addition to the coating gas, a carrier gas symbolized by the arrows 20 is supplied and this takes place through the annular space 21 formed by the inner tube 6 and the casing tube 7. There it flows through the porous ring 9 into the intermediate space 11, penetrates through the porous plate 10, and flows then farther upwards into the reaction tube 2 while surrounding the coating gas, the porous plate 10 serving to equalize the velocity profile. In the reaction tube 2, the carrier gas produces a stirring up of the fuel core particles. The carrier gas and coating gas are so adjusted with reference to their respective flow rates that the fuel cores are held in place in the reaction tube 2 without further support, the balance velocity of the fuel cores therefore not being understepped.

After a certain coating duration, thus after reaching a desired layer thickness on the fuel core particles, the coating gas is replaced by argon. The argon stream is so adjusted that it velocity lies above the free-fall velocity of an uncoated fuel core particle. In this way fragments or soot are prevented from getting into the inner tube 6 during emptying of the reaction tube 2 and attaching themselves there and acting as interfering bodies in the suceeding coating operation.

Therafter the carrier gas is turned off. The argon stream is, however, still great enough that the balance velocity of the fuel core particles in the reaction tube 6 is not yet understepped and the fuel core particles therefore still remain there. In the space below the diaphram opening 3, there is therefore still a pressure that corresponds to the pressure drop of the diaphragm opening 3 and that of the bed of fuel core particles. Now the gas supply lance 5 can be lowered, as is illustrated in FIG. 2. The lowering should proceed far enough for the laminar central stream 19 to be unable any more to reach the bore 12 in the porous plate 10.

For the emptying procedure, the valve 18 in the overflow line 17 is now opened. Since the pressure drop through the overflow line 17 and the valve 18 is less than through the diaphragm opening 3 and the bed in the reaction tube 2, the argon stream will substantially escape through this overflow line 17. The fuel core particles in the reaction tube 2 are then no longer sufficiently impelled by flow and fall through the diaphragm opening 3, downwards onto the porous plate 10. There they roll inwards to the bore 12 and then fall further downwards into the portion of the intermediate space 11 formed by casing tube 7 and outer tube 4. There they land on the catching surface 15 of the catch body 14 and then roll into the discharge tube 16, by which they get into a collecting container filled with inert gas, not shown here in the drawing.

In order to prevent that between the gas supply lance 5 and catch body 14 soot and perhaps fragments of the fuel core particles should be deposited which would impair the movability of the gas supply lance 5, a flushing gas, symbolized by the arrows 22, is forced through the gap between the catch body 14 and the gas supply lance 5. The flushing gas escapes likewise through the overflow line 17. By variation of the flow cross-section of the valve 18 in the overflow line 17 the pressure drop and thereby the flow applied to the bed of fuel core particles can be varied. In this manner, the emptying procedure can be adjusted to the requirements. A corresponding effect can also be obtained by not fully shutting off the carrier gas. This scheme is recommended when the volume flow of the central stream 19 is not sufficient to hold the fuel core particles in the reaction tube 2 before the lowering of the gas supply lance 5.

As soon as the discharge procedure has terminated, the valve 18 in the overflow line 17 is closed and the gas supply lance 5 is again raised into the coating operation position of FIG. 1. The reaction tube 2 can then again be filled with a new charge of fuel core particles. The carrier gas is again turned on and the argon stream in the inner tube 6 is replaced by the coating gas so that a new coating process can begin.

FIGS. 3 and 4 show the upper part of a modified form of embodiment of a gas feed unit 1, with FIG. 3 in the coating operation position and FIG. 4 in the emptying position.

The only change with respect to the embodiment of FIGS. 1 and 2 concerns the conical ring 13 that here is made sufficiently thick for it to open up, upon lowering of the gas supply lance 5, enough area of cross-section in the bore 12 of the porous plate for the fuel core particles, falling out of the action tube 2 during emptying, to pass down through this area even though the upper end of the inner tube 6 still goes through the bore 13 (compare FIG. 4). This has the advantage that the gas supply lance 5 does not have to be lowered as far as in the case of the embodiments of FIGS. 1 and 2. Construction height of the installation is thereby saved.

In other respects, the gas feed flow unit 1 is indentical with the one shown in FIGS. 1 and 2, even as far as concerns the parts not shown in FIGS. 3 and 4.

FIGS. 5 and 6 show a further embodiment of the feed unit 1 of the fluidized bed over and, here again, only the upper part thereof.

The only change with regard to the embodiments shown in the foregoing figures consists in that the inner tube 6 of the gas supply lance 5 no longer carries a conical ring, but instead the porous plate 10 is affixed to the inner tube 6 itself while its outer rim is detached from the outer tube 4. The porous plate 10 now cooperates with a conical widening 23 of the outer tube 4 that flares out downwards and is seated in the upper part thereof when the system is in the coating operation position. For the emptying operation, the gas supply lance 5 is moved downward so that the plate 10 affixed to the inner tube 6 gets into a widened region of the outer tube 4 and a ring-shaped gap 24 for the fuel core particles is accordingly formed.

As a result of the conical configuration of the porous plate, the fuel cores roll outwards through this gap 24 and then fall down where they are guided into the offtake tube by a catching body not shown in these two figures. This last embodiment also has the advantage that the gas supply needs to be lowered only a little in order to make possible the passage of the fuel core particles in the region of the porous plate 10. In other respects this feed flow unit 1 corresponds to those shown in the previously described figures.

We claim:

1. Fluidized bed furnace for the coating of nuclear reactor fuel particles comprising a reaction tube for containing said particles in a fluidized bed therein, having at least one orifice at its bottom end;

duct means below said bottom end of said reaction tube including an outer tube for supply of a carrier gas to said reaction tube, having an inlet and being connected for outlet purposes to said reaction tube, and at least one inner tube for supply of a coating gas disposed inside said outer tube below said at least one orifice;

a porous plate (10) extending across the interspace between outer and inner tubes, said inlet of said outer tube being located below said porous plate and connecting with said interspace, and overflow duct means (17, 18) for venting said outer tube, said at least one inner tube being axially movable to an extent sufficient to lower it, from its normal position during operation of the furnace, to a position to which a passage for downwardly falling fuel particles is produced, a collecting device being located in said interspace below said outer tube inlet for catching particles that have fallen through said passage, and a coating gas supply, an inert gas supply, and means for replacing the coating gas in said at least one inner tube with the inert gas and vice versa.

2. Fluidized bed furnace as defined in claim 1 in which said porous plate (10) is fixedly mounted and said inner tube is capable of being lowering said inner tube (6) so far that its upper end is lower than said porous plate (10).

3. Fluidized bed furnace as defined in claim 2 in which said inner tube is capable of being lowered so far that a gas flow (19) issuing from said inner tube does not reach said porous plate (10).

4. Fluidized bed furnace as defined in claim 1 in which said at least one inner tube has an external thickening (13) of upwardly tapering diameter by which it is seated in said porous plate when raised to its uppermost position and by the downward movement of which an annular passage (12) is cleared for passage of fuel particles.

5. Fluidized bed furnace as defined in claim 1 in which said porous plate (10) is affixed to said at least one inner tube (6) for displacement therewith and in which said outer tube has an enlargement (23) of its internal diameter in the region of said porous plate (10).

6. Fluidized bed furnace as defined in claim 1 in which said collecting device includes a catching body (14) filling up said interspace so as to block it downwardly and having a catching surface (15) helically inclined toward an external discharge tube (16).

7. Fluidized bed furnace as defined in claim 1 in which said overflow duct means is equipped with a valve (18).

8. Fluidized bed furnace as defined in claim 6 in which said overflow duct means comprises an overflow pipe (17) branching off from said discharge tube (16) and a valve (18) for said overflow pipe.

9. Fluidized bed furnace as defined in claim 1 in which the portion of said at least one inner tube (6)

which is below said porous plate even in the upper position of said inner tube is provided with a casing (7) having outlets (9) at the top of said casing constituting said inlet of said outer tube, whereby the annular space (21) between said casing (7) and said inner tube (6) is capable of being used supply carrier gas to said interspace.

10. Method for emptying a fluidized bed furnace for the coating of nuclear reactor fuel particles of the said furnace having a reaction tube for containing said particles in a fluidized bed therein, having at least an orifice at its bottom end, duct means below said bottom end of said reaction tube including an outer tube for supply of a carrier gas to said reaction tube, having an inlet and being connecting for outlet purposes to said reaction tube, and at least one inner tube for supply of a coating gas disposed inside said outer tube below said at least one orifice, a porous plate extending across the innerspace between outer and inner tubes, said inlet of outer tube being located below said porous plate and connecting with said interspace, said at least one inner tube being axially movable to an extent sufficient to lower it in its normal position during operation of the furnace, to a position in which a passage for downwardly falling fuel particles is produced, a collecting device being located in said interspace below said outer tube inlet for catching particles that have fallen through said passage, a coating gas supply, an inert gas supply and means for replacing the coating gas in said at least one inner tube with the inert gas and vice versa, said method beginning at the end of a fluidized bed coating operation that was carried on with a combined flow of coating gas and carrier gas, said method comprising the steps of:

replacing the flow of coating gas in the inner tube of the duct means connected below the orifice of the reaction tube of the furnace by a flow of inert gas and substantially at the same time interrupting the supply of the carrier gas;

lowering the inner tube (6) from its operating position to a lower position, and directing the flow of inert gas from said inner tube (6) toward said orifice of said furnace in such a manner that fuel particles and particle fragments fall out of the reaction tube in a path bypassing the mouth of said inner tube.

* * * * *